United States Patent
Yokoyama

(10) Patent No.: US 10,317,959 B2
(45) Date of Patent: Jun. 11, 2019

(54) SERVER DEVICE, SERVER CONTROL METHOD, AND PROGRAM

(71) Applicant: NEC Corporation, Tokyo (JP)

(72) Inventor: Jun Yokoyama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 8 days.

(21) Appl. No.: 15/463,454

(22) Filed: Mar. 20, 2017

(65) Prior Publication Data

US 2017/0277233 A1 Sep. 28, 2017

(30) Foreign Application Priority Data

Mar. 23, 2016 (JP) .................................. 2016-058319

(51) Int. Cl.
| | |
|---|---|
| *G06F 1/20* | (2006.01) |
| *H05K 7/20* | (2006.01) |
| *G05B 15/02* | (2006.01) |
| *G06F 11/30* | (2006.01) |

(52) U.S. Cl.
CPC .............. *G06F 1/20* (2013.01); *G05B 15/02* (2013.01); *G06F 1/206* (2013.01); *G06F 11/3058* (2013.01); *H05K 7/20727* (2013.01); *H05K 7/20836* (2013.01); *Y02D 10/16* (2018.01)

(58) Field of Classification Search
None
See application file for complete search history.

(56) References Cited

U.S. PATENT DOCUMENTS

| | | | |
|---|---|---|---|
| 2004/0130868 A1 | 7/2004 | Schwartz et al. | |
| 2005/0257213 A1* | 11/2005 | Chu ................ | G06F 11/2028 717/170 |

FOREIGN PATENT DOCUMENTS

| | | |
|---|---|---|
| JP | 2004-355421 A | 12/2004 |
| JP | 2006-011793 A | 1/2006 |
| JP | 2009-187347 A | 8/2009 |
| JP | 2010-123071 A | 6/2010 |
| JP | 2013-092822 A | 5/2013 |
| JP | 2015-050240 A | 3/2015 |
| JP | 2015-106313 A | 6/2015 |

OTHER PUBLICATIONS

Japanese Office Action issued by the Japan Patent Office for the Japanese Application No. 2016-058319 dated Aug. 1, 2017 (5 pages).
Japanese Office Action corresponding to Japanese Application No. 2016-058319 dated Feb. 28, 2017 (13 pages).

* cited by examiner

*Primary Examiner* — Ryan A Jarrett
(74) *Attorney, Agent, or Firm* — Wilmer Cutler Pickering Hale and Dorr LLP

(57) ABSTRACT

A server device having a server module and a cooling fan in a chassis includes: a single management unit configured to control the server module and the cooling fan; and a monitoring unit configured to monitor the running status of the management unit. The monitoring unit is configured to execute thermal control of the inside of the chassis on the basis of the result of monitoring of the management unit.

10 Claims, 9 Drawing Sheets

Fig.5
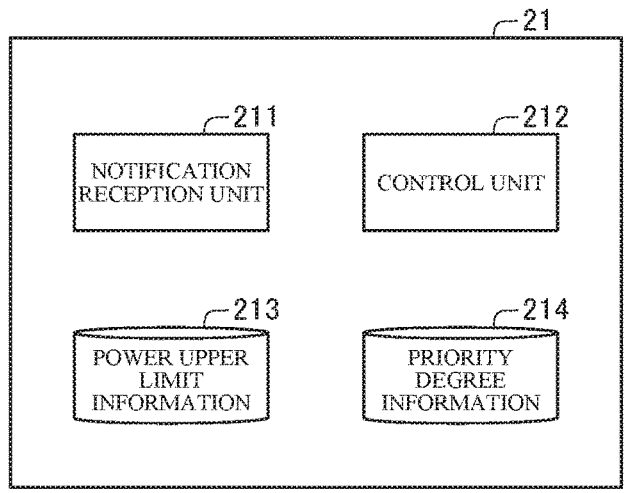
Fig.6
| SERVER MODULE | PRIORITY DEGREE | ALLOCATED ENERGY |
|---|---|---|
| x | 1 | $\alpha$ |
| X | 2 | $\beta$ |
| Y | 2 | $\beta$ |
| ⋮ | ⋮ | ⋮ |
| TOTAL VALUE | | $\gamma(\alpha+\beta+\beta+\cdots)$ |
Fig.7
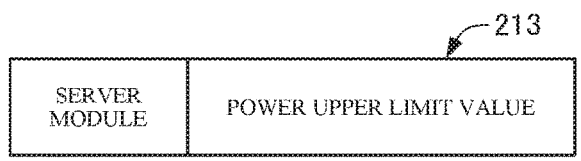
Fig.8
| PRIORITY DEGREE | SERVER MODULE |
|---|---|
| 1 | SERVER MODULE x, SERVER MODULE y, ⋯⋯ |
| 2 | SERVER MODULE X, SERVER MODULE Y, ⋯⋯ |
| 3 | SERVER MODULE $\alpha$, SERVER MODULE $\beta$, ⋯⋯ |

SERVER DEVICE, SERVER CONTROL METHOD, AND PROGRAM

INCORPORATION BY REFERENCE

This application is based upon and claims the benefit of priority from Japanese patent application No. 2016-058319, filed on Mar. 23, 2016, the disclosure of which is incorporated herein in its entirety by reference.

TECHNICAL FIELD

The present invention relates to a server device, a server control method, and a program. More specifically, the present invention relates to a server device, a server control method and a program which enable cost reduction while maintaining reliability.

BACKGROUND ART

A server device which holds a plurality of server modules in a chassis and controls the temperature of the inside of the chassis with a built-in fan is known.

For example, Patent Document 1 discloses a computer system which has a plurality of fans and two fan controllers. According to Patent Document 1, the two fan controllers monitor all the fans, and each of the fan controllers is configured to increase the speed of rotation of a fan controlled thereby when detecting a failure of a fan controlled by the other fan controller. Such a configuration can secure high reliability.

Patent Document 1: United States Patent Application Publication No. US 2004/0130868

As disclosed by Patent Document 1, it is general to equip a server device with two fan controllers (chassis management modules which control fans) for securing reliability and thereby make fan control redundant.

However, redundant chassis management modules such as fan controllers need extra costs. Therefore, in terms of costs, it is desirable to reduce the number of chassis management modules. On the other hand, if a server device has only one chassis management module, a failure of the chassis management module brings the device to an uncontrollable state. Therefore, in terms of reliability, it is not desirable to reduce the number of chassis management modules.

Thus, for a server device, reduction of the number of chassis management modules is desirable in terms of costs, but reduction of the number of chassis management modules is difficult in terms of reliability. In other words, a server device has a problem that it is difficult to reduce costs while securing reliability.

SUMMARY OF THE INVENTION

Accordingly, an object of the present invention is to provide a server device which solves the problem that it is difficult to reduce costs while securing reliability.

In order to achieve the object, a server device as an aspect of the present invention is a server device having a server module and a cooling fan in a chassis.

The server device includes:
 a single management unit configured to control the server module and the cooling fan; and
 a monitoring unit configured to monitor a running status of the management unit.

The monitoring unit is configured to execute thermal control of an inside of the chassis on a basis of a result of monitoring of the management unit.

Further, a server control method as another aspect of the present invention is a server control method executed by a server device having a server module and a cooling fan in a chassis.

The server device includes a single management unit configured to control the server module and the cooling fan.

The server control method includes: monitoring a running status of the management unit, and executing thermal control of an inside of the chassis on a basis of a result of monitoring of the management unit.

Further, a program as another aspect of the present invention includes instructions for causing a server device having a server module and a cooling fan in a chassis to realize:
 a single management unit configured to control the server module and the cooling fan; and
 a monitoring unit configured to monitor a running status of the management unit.

The monitoring unit is configured to execute thermal control of an inside of the chassis on a basis of a result of monitoring of the management unit.

With the configurations as described above, the present invention can provide a server device which solves the problem that it is difficult to reduce costs while securing reliability.

BRIEF DESCRIPTION OF DRAWINGS

FIG. 5 is a block diagram showing an example of the configuration of a server module shown in FIG. 4;

FIG. 6 is a diagram showing an example of allocation of energy based on the degree of priority;

FIG. 7 is a diagram showing an example of power upper limit information shown in FIG. 5;

FIG. 8 is a diagram showing an example of priority degree information shown in FIG. 5;

EXEMPLARY EMBODIMENT

First Exemplary Embodiment

Figure 1:
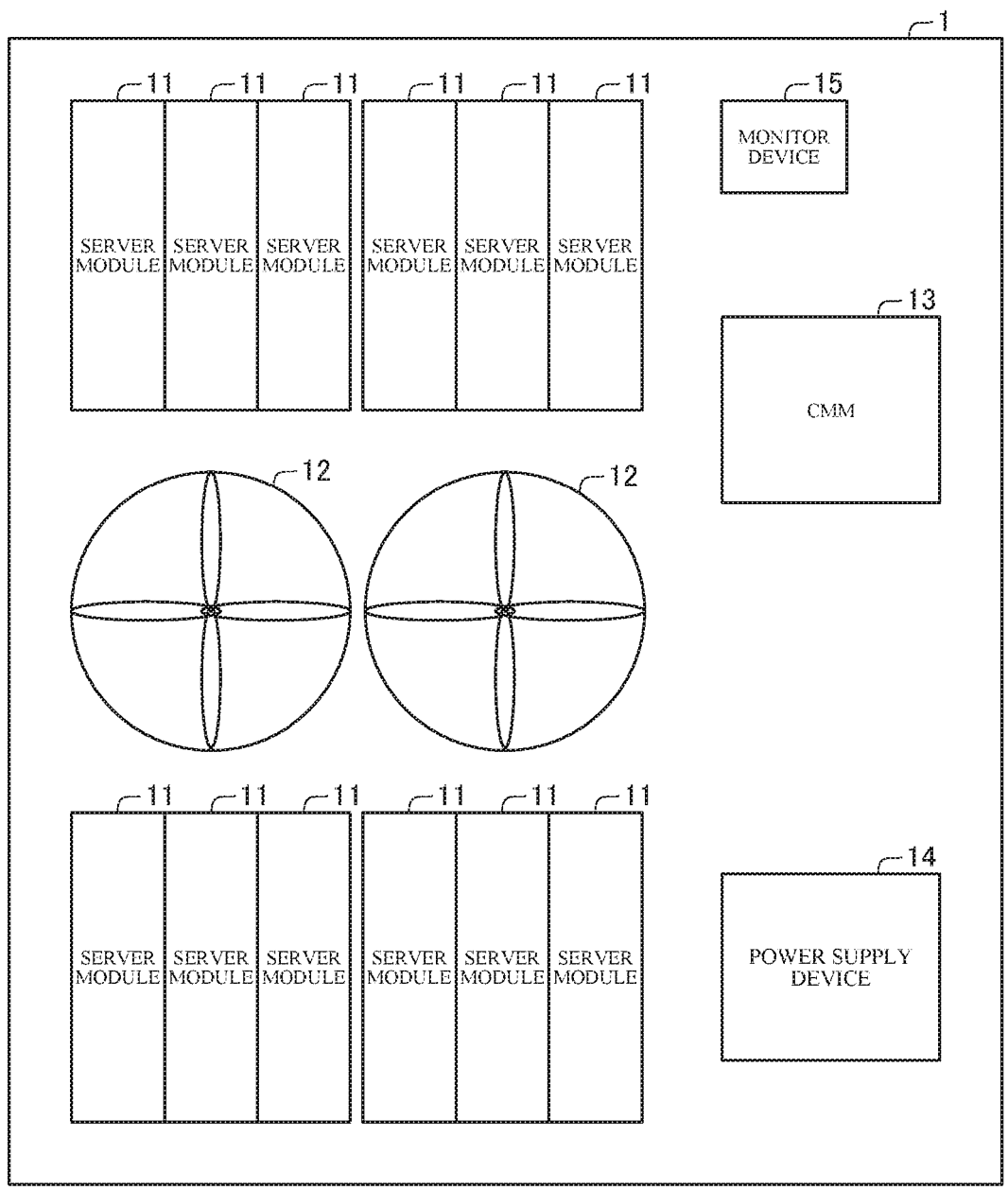
FIG. 1 is a diagram showing an example of the configuration of a server device according to a first exemplary embodiment of the present invention.
Figure 2:
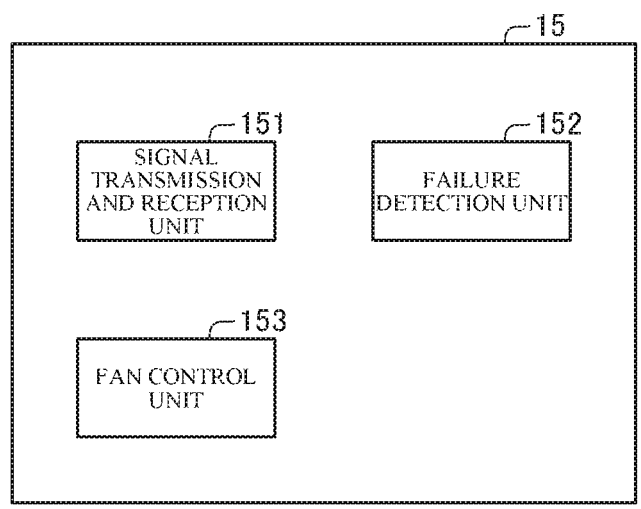
FIG. 2 is a block diagram showing an example of the configuration of a monitor device shown in FIG. 1.
Figure 3:
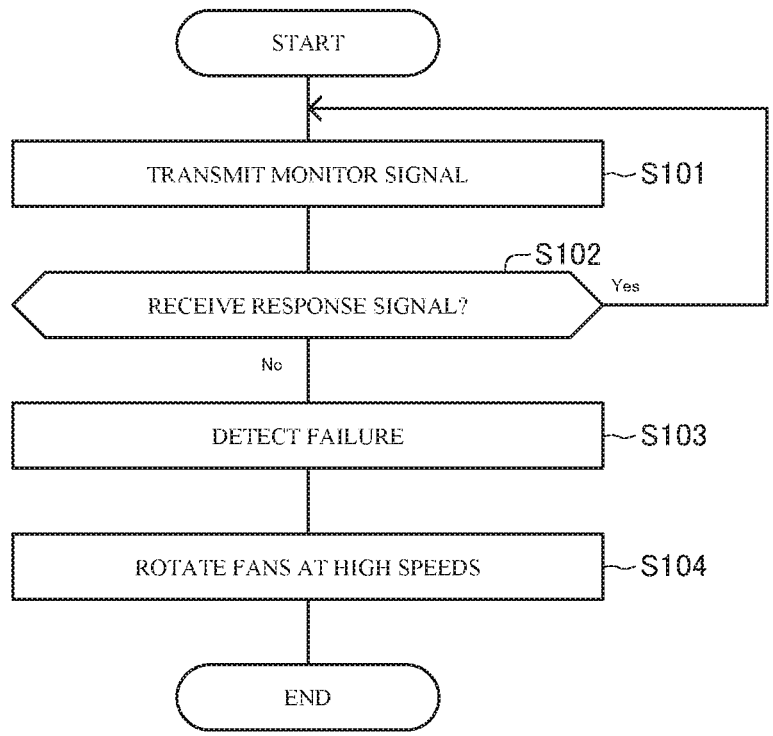
FIG. 3 is a flowchart showing an example of the operation of the monitor device according to the first exemplary embodiment of the present invention.

A first exemplary embodiment of the present invention will be described with reference to FIGS. 1 to 3. FIG. 1 is a diagram showing an example of the configuration of a server device 1. FIG. 2 is a block diagram showing an example of the configuration of a monitor device 15. FIG. 3 is a flowchart showing an example of the operation of the monitor device 15.

In the first exemplary embodiment of the present invention, the server device 1 having a plurality of server modules 11 and a plurality of fans 12 in a chassis will be described. The server device 1 in this exemplary embodiment has one CMM (Chassis Management Module) 13 and causes the CMM 13 to control the server modules 11 and the fans 12. Moreover, the server device 1 causes the monitor device 15 to monitor the CMM 13. As described later, in this exemplary embodiment, when a failure of the CMM 13 is detected as a result of monitoring of the CMM 13 by the monitor device 15, control is executed so as to increase the number of rotations of the fans 12.

Referring to FIG. 1, the server device 1 has the server modules 11, the fans 12, the CMM 13, a power supply device 14, and the monitor device 15.

The server modules 11 each have a CPU (Central Processing Unit), a memory, and so on which are not illustrated. The server modules 11 are connected to the power supply device 14 and operate with power supplied by the power supply device 14. Moreover, the server modules 11 are connected to the CMM 13 and operate under control by the CMM 13.

The fans 12 (cooling fans) are connected to the power supply device 14 and operate with power supplied by the power supply device 14. Moreover, the fans 12 are connected to the CMM 13 and operate under control by the CMM 13. For example the fans 12 rotate under control by the CMM 13. Moreover, the fans 12 rotate at a number of rotations based on an instruction by the CMM 13.

Further, the fans 12 in this exemplary embodiment are connected to the monitor device 15. In a case where the monitor device 15 detects a failure of the CMM 13, the fans 12 are controlled by the monitor device 15 to increase the number of rotations and rotate at high speeds (for example, the fans 12 rotate at the highest speed of the numbers of rotations at which the fans 12 can rotate).

The CMM 13 (a management unit) has a CPU, a memory, and so on which are not illustrated. The CMM 13 is connected to the power supply device 14 and operate with power supplied by the power supply device 14. Moreover, the CMM 13 is connected to the server modules 11 and the fans 12, and controls the server modules 11 and the fans 12. For example, the CMM 13 selects the server module 11 to operate and operates the selected server module 11. Moreover, the CMM 13 selects the fan 12 to operate and operates the selected fan 12, and controls the number of rotations of the fan 12. The abovementioned control by the CMM 13 is realized by, for example, execution of a program stored in a storage device such as a memory of the CMM 13 by an arithmetic device such as a CPU.

Further, the CMM 13 is connected to the monitor device 15 and regularly receives a monitor signal from the monitor device. Upon receiving a monitor signal, the CMM 13 transmits a response signal to the monitor device 15 in accordance with the monitor signal. The CMM 13 notifies the monitor device 15 that it is not broken, for example, in this manner.

The power supply device 14 is connected to an external power supply, and is also connected to the server modules 11, the fans 12, the CMM 13, and the monitor device 15. The power supply device 14 is supplied with power by the external power supply, and supplies the power to the server modules 11, the fans 12, the CMM 13, and the monitor device 15.

The monitor device 15 (a monitoring unit) monitors the running status of the CMM 13. The monitor device 15 is connected to the CMM 13, and monitors the CMM 13 by transmitting and receiving signals to and from the CMM 13. Moreover, the monitor device 15 is connected to the fans 12, and executes thermal control inside the chassis by controlling the number of rotations of the fans 12 on the basis of the result of monitoring of the CMM 13.

FIG. 2 shows an example of components included by the monitor device 15. Referring to FIG. 2, the monitor device 15 includes a signal transmission and reception unit 151, a failure detection unit 152, and a fan control unit 153. The respective units are realized by, for example, execution of a program stored in a storage device (not shown) of the monitor device 15 by an arithmetic device (not shown) of the monitor device 15.

The signal transmission and reception unit 151 regularly transmits a monitor signal to the CMM 13. Moreover, the signal transmission and reception unit 151 receives a response signal from the CMM 13 as a response to the transmitted monitor signal.

An interval at which the signal transmission and reception unit 151 transmits a monitor signal may be any interval.

The failure detection unit 152 detects a failure of the CMM 13 on the basis of the result of transmission and reception of signals by the signal transmission and reception unit 151. For example, in a case where, though the signal transmission and reception unit 151 has transmitted a monitor signal to the CMM 13, the signal transmission and reception unit 151 does not receive a response signal as a response to the monitor signal for a given time, the failure detection unit 152 detects a failure of the CMM 13. Herein, the given time may be set to any time.

The fan control unit 153 is triggered by detection of a failure of the CMM 13 by the failure detection unit 152 to rotate the fans 12 at high speeds. For example, when the failure detection unit 152 detects a failure of the CMM 13, the fan control unit 153 instructs the fans 12 to rotate at a predetermined number of rotations.

Thus, the monitor device 15 is configured to monitor the CMM 13 and control the number of rotations of the fans 12 on the basis of the result of monitoring of the CMM 13.

The above is an example of the configuration of the server device 1. Next, referring to FIG. 3, an example of the operation of the monitor device 15 will be described.

Referring to FIG. 3, the monitor device 15 regularly transmits a monitor signal (step S101). When receiving the monitor signal, the CMM 13 of the server device 1 transmits a response signal to the monitor device 15 in response to the monitor signal.

In a case where the monitor device 15 receives the response signal as a response to the transmitted monitor signal (step S102, Yes), the failure detection unit 152 of the monitor device 15 determines that the CMM 13 is not broken. In this case, in the next period, the signal transmission and reception unit 151 transmits a monitor signal again (step S101). On the other hand, in a case where after transmitting a monitor signal, the monitor device 15 does not receive a response signal within a given time (step S102, No), the failure detection unit 152 of the monitor device 15 detects a failure of the CMM 13 (step S103). Then, the fan control unit 153 is triggered by detection of the failure of the CMM 13 by the failure detection unit 152 to rotate the fans 12 at high speeds (step S104). As a result, the fans 12 rotate at high speeds.

The monitor device 15 monitors the CMM 13 with such an operation, for example. Then, in a case where a failure of the CMM 13 is detected as a result of monitoring, the monitor device 15 causes the fans 12 to rotate at high speeds.

Thus, the server device 1 in this exemplary embodiment has the fans 12, the CMM 13, and the monitor device 15. The monitor device 15 is configured to monitor the CMM 13. With such a configuration, the monitor device 15 can control the number of rotations of the fans 12 on the basis of the result of monitoring of the CMM 13. As a result, for example, the monitor device 15 can execute control to increase the number of rotations of the fans 12 in a case where the CMM 13 is broken. Consequently, for example, even when the CMM 13 is broken, it is possible by increasing the number of rotations of the fans 12 to prevent heat from filling the inside of the server device 1 and prevent thermal control inside the server device 1 from being disabled, whereby reliability can be secured. Moreover, when compared with the CMM 13, the function of the monitor device 15 is limited and can be realized at low costs. Therefore, it is possible to reduce costs as compared with a case of making the CMM 13 redundant.

Second Exemplary Embodiment

Figure 4:
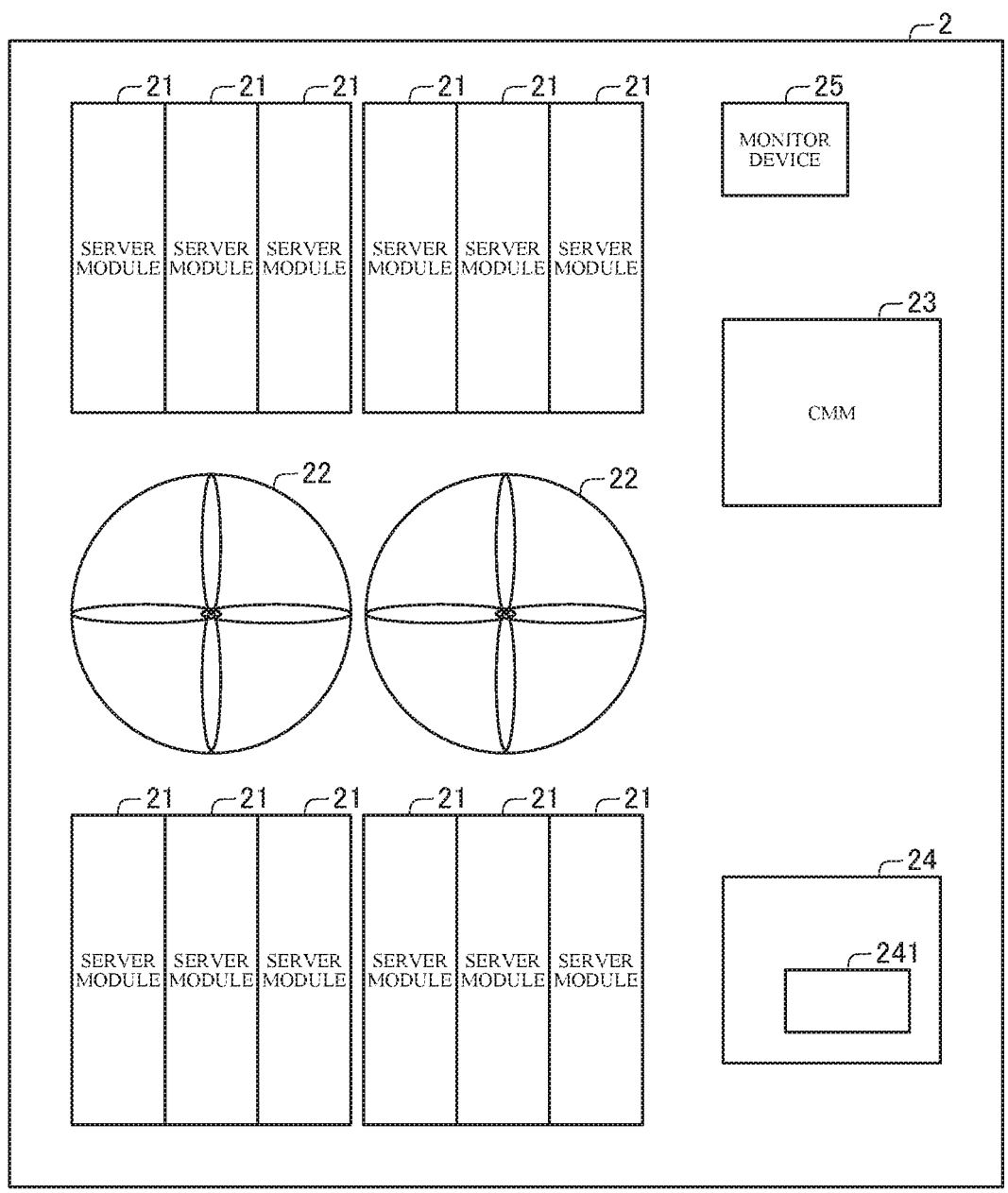
FIG. 4 is a diagram showing an example of the configuration of a server device according to a second exemplary embodiment of the present invention.
Figure 9:
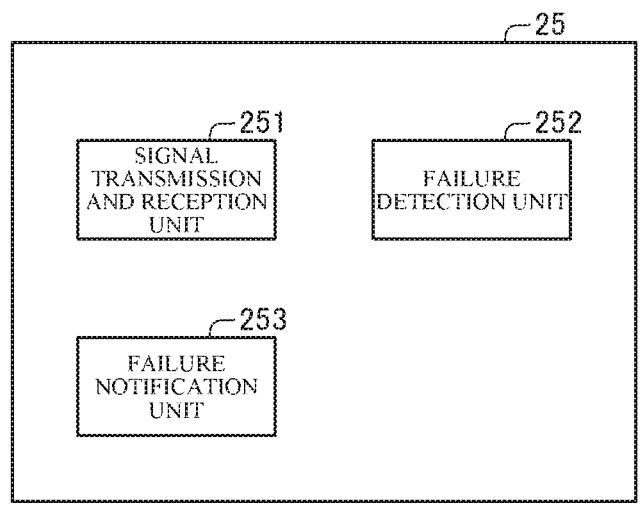
FIG. 9 is a block diagram showing an example of the configuration of a monitor device shown in FIG. 4.
Figure 10:
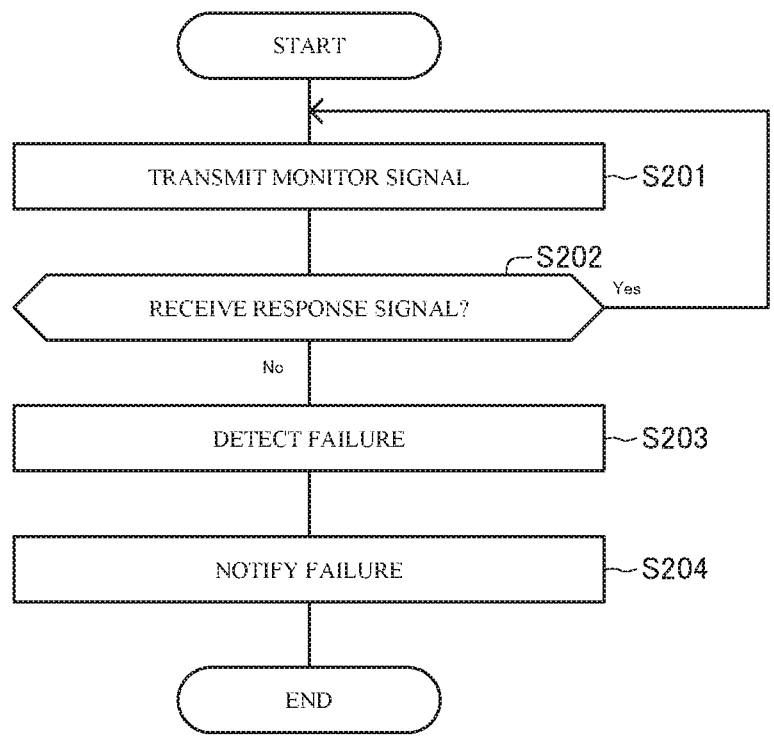
FIG. 10 is a flowchart showing an example of the operation of the monitor device according to the second exemplary embodiment of the present invention.
Figure 11:
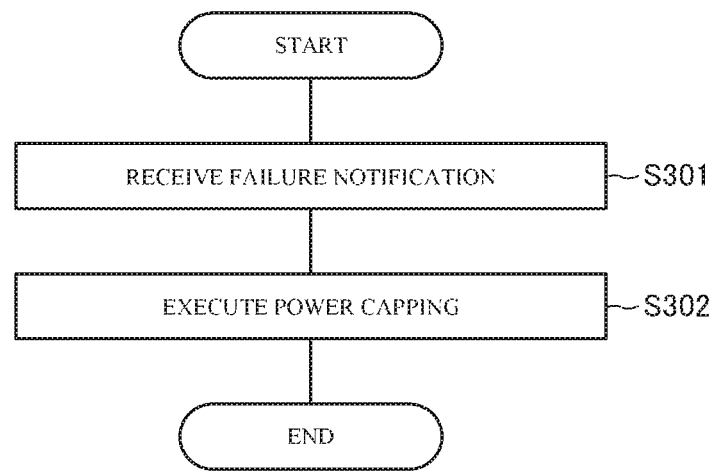
FIG. 11 is a flowchart showing an example of the operation of the server module according to the second exemplary embodiment of the present invention.

Next, a second exemplary embodiment of the present invention will be described with reference to FIGS. 4 to 11. FIG. 4 is a diagram showing an example of the configuration of a server device 2. FIG. 5 is a block diagram showing an example of the configuration of a server module 21. FIG. 6 is a diagram showing an example of allocation of energy based on the degree of priority. FIG. 7 is a diagram showing an example of power upper limit information 213. FIG. 8 is a diagram showing an example of priority degree information 214. FIG. 9 is a block diagram showing an example of the configuration of a monitor device 25. FIG. 10 is a flowchart showing an example of the operation of the monitor device 25. FIG. 11 is a flowchart showing an example of the operation of the server module 21.

In the second exemplary embodiment of the present invention, the server device 2 having a plurality of server modules 21 and a plurality of fans 22 in a chassis will be described. The server device 2 in this exemplary embodiment has one CMM 23 and causes the CMM 23 to control the server modules 21 and the fans 22. Moreover, the server device 2 causes the monitor device 25 to monitor the CMM 23. As described later, in this exemplary embodiment, in a case where a failure of the CMM 23 is detected as a result of monitoring of the CMM 23 by the monitor device 25, it is notified to the server module 21. The server module 21 having received the notification executes power capping in response to the notification.

Referring to FIG. 4, the server device 2 has the server modules 21, the fans 22, the CMM 23, a power supply device 24, and the monitor device 25.

The server modules 21 each have a CPU, a memory, and so on which are not illustrated. The server modules 21 are connected to the power supply device 24 and operate with power supplied by the power supply device 24. Moreover, the server modules 21 are connected to the CMM 23 and operate under control by the CMM 23. Moreover, the server modules 21 are connected to the monitor device 25 and receive notification of a failure of the CMM 23 described later from the monitor device 25.

Further, the server module 21 in this exemplary embodiment can switch its operation status from a normal operation to a low-power-consumption operation in which power consumption is less than in the normal operation. Moreover, the server module 21 can switch from the low-power-consumption operation to the normal operation. The low-power-consumption operation that power consumption is less than in the normal operation is referred to as a power capping function or power capping. In general, power consumptions of a CPU and a memory decrease when their operating frequencies are decreased. Therefore, by limiting the maximum operating frequency, it is possible to regulate the maximum power consumption in some stages. Moreover, an HDD (Hard Disk Drive) or the like can decrease its power consumption by limiting the number of rotations of the disk.

FIG. 5 shows an example of components included by the server module 21. Referring to FIG. 5, the server module 21 includes a notification reception unit 211, a control unit 212, power upper limit information 213, and priority degree information 214. The respective units are realized by, for example, execution of a program stored in a storage device (not shown) by an arithmetic device (not shown). Moreover, the power upper limit information 213 and the priority degree information 214 are stored, for example, in a storage device such as a nonvolatile memory (not shown).

The server module 21 does not necessarily need to include both the power upper limit information 213 and the priority degree information 214. The server module 21 has only to include at least one of the power upper limit information 213 and the priority degree information 214.

The notification reception unit 211 receives notification of detection of a failure of the CMM 23 from the monitor device 25.

When the notification reception unit 211 receives notification from the monitor device 25, the control unit 212 switches the operation status of the server module 21 from the normal operation to the low-power-consumption operation in response to the notification. That is to say, the control unit 212 puts an upper limit on power consumed by the server module 21 including the control unit 212 itself in response to notification received from the monitor device 25.

For example, when receiving notification from the monitor device 25, the control unit 212 refers to the power upper limit information 213. Then, the control unit 212 executes power capping so that the upper limit of power shown by the power upper limit information 213 becomes the upper limit of power consumed by the server module 21 including the control unit 212 itself. The control unit 212 puts an upper limit on power consumed by the server module 21 in accordance with notification received from the monitor device 25, for example, in this manner.

Further, for example, the control unit 212 executes power capping in accordance with the degree of priority shown by the priority degree information 214 as shown in FIG. 6. For example, when receiving notification from the monitor device 25, the control unit 212 refers to power supply information 241 included by the power supply device 24 to refer to power budget information included by the power supply information 241. Then, the control unit 212 allocates energy to the server module 21 from a power budget (y in FIG. 6) included by the power budget information in accordance with the degree of priority shown by the priority degree information 214. For example, the control unit 212 allocates energy from the power budget so that larger energy is allocated to the server module 21 with a higher priority degree. For example, in FIG. 6, assuming a priority degree 1 is higher in degree of priority than a priority degree 2, allocated energy a for the priority degree 1 is a larger value than allocated energy 13 for the priority degree 2. Then, the control unit 211 executes power capping so that the allocated energy becomes the upper limit. The control unit 211 puts an upper limit on power consumed by the server module 21 in accordance with notification received from the monitor device 25, for example, in the above manner.

The power upper limit information 213 shows a power upper limit value, which is the upper limit of power consumed by the server module 21 as shown in FIG. 7 (the power upper limit value may represent the upper limit value of energy). As described above, the control unit 212 executes power capping so that the upper limit of power shown by the power upper limit information 213 becomes the upper limit of power consumed by the server module 21 including the control unit 212. The value of the power upper limit value shown in the power upper limit information 213 can be set to any value. Moreover, as described above, in a case where the upper limit is determined on the basis of the priority degree information 214, allocated energy is equivalent to the power upper limit value.

The priority degree information 214 shows the degree of priority of the server module 21 of the server modules 21 included by the server device 2. For example, referring to FIG. 8, in the priority degree information 214, a priority degree is associated with a server module corresponding to the degree of priority (for example, in FIG. 8, a lower number of a degree of priority represents a higher degree of priority). The control unit 212 can check the degree of priority assigned to the server module 21 including the control unit 212 by referring to the priority degree information 214. As described above, the control unit 212 obtains energy corresponding to the degree of priority shown by the priority degree information 214 from the power budget.

The fans 22 are connected to the power supply device 24 and operate with power supplied by the power supply device 24. Moreover, the fans 22 are connected to the CMM 23 and operate under control by the CMM 23. For example, the fans 22 rotate under control by the CMM 23. Moreover, the fans 22 rotate at the number of rotations based on an instruction by the CMM 23.

The CMM 23 has the same configuration as the configuration of the CMM 13 described in the first exemplary embodiment. That is to say, the CMM 23 has a CPU, a memory, and so on which are not illustrated. The CMM 23 is connected to the power supply device 24 and operates with power supplied by the power supply device 24. Moreover, the CMM 23 is connected to the server modules 21 and the fans 22, and controls the server modules 21 and the fans 22. For example, the CMM 23 selects the server module 21 to operate and operates the selected server module 21. Moreover, the CMM 23 selects the fan 22 to operate, and controls the number of rotations of the fan 22.

Further, the CMM 23 is connected to the monitor device 25, and regularly receives a monitor signal from the monitor device 25. Upon receiving a monitor signal, the CMM 23 transmits a response signal to the monitor device 25 in response to the monitor signal. The CMM 23 notifies the monitor device 25 that the CMM 23 itself is not broken, for example, in the above manner.

The power supply device 24 is connected to an external power supply and is also connected to the server modules 21, the fans 22, the CMM 23, and the monitor device 25. The power supply device 24 is supplied with power by the external power supply, and supplies power to the server modules 21, the fans 22, the CMM 23, and the monitor device 25.

Further, the power supply device 24 has the power supply information 241. As described before, the power supply information 241 includes the power budget information. The power budget information is used by the control unit 212 of the server module 21.

The monitor device 25 monitors the running status of the CMM 23. The monitor device 25 is connected to the CMM 23, and monitors the CMM 23 by transmitting and receiving signals to and from the CMM 23. Moreover, the monitor device 25 is connected to the server modules 21 and, in the case of determining that the CMM 23 is broken on the basis of the result of monitoring of the CMM 23, notifies it to the server modules 21. As described above, upon receiving the notification, the server modules 21 execute power capping in accordance with the notification.

In general, the more the power consumption is, the higher the temperature of the server module 21 is. Therefore, by executing power capping, it is possible to execute control not to increase (or control to decrease) the temperature of the server module 21. In other words, the monitor device 25 notifies a failure of the CMM 23 to the server modules 21, thereby executing thermal control in the chassis.

FIG. 10 shows an example of components included by the monitor device 25. Referring to FIG. 10, the monitor device 25 includes a signal transmission and reception unit 251, a failure detection unit 252, and a failure notification unit 253. The respective units are realized by, for example, execution of a program stored in a storage device (not shown) of the monitor device 25 by an arithmetic device (not shown) of the monitor device 25.

The signal transmission and reception unit 251 regularly transmits a monitor signal to the CMM 23. Moreover, the signal transmission and reception unit 251 receives a response signal from the CMM 23 as a response to a transmitted monitor signal. An interval at which the signal transmission and reception unit 251 transmits a monitor signal may be any interval.

The failure detection unit 252 detects a failure of the CMM 23 on the basis of the result of transmission and reception of signals by the signal transmission and reception unit 251. For example, in a case where, though the signal transmission and reception unit 251 has transmitted a monitor signal to the CMM 23, the signal transmission and reception unit 251 does not receive a response signal as a response to the monitor signal for a given time, the failure detection unit 252 detects a failure of the CMM 23.

When the failure detection unit 252 detects a failure of the CMM 23, the failure notification unit 253 notifies the failure of the CMM 23 to the server module 21. As described above, the server module 21 executes power capping in accordance with the notification from the failure notification unit 253.

Thus, the monitor device 25 monitors the CMM 23 and, when the CMM 23 is broken, notify the failure to the server modules 21. Moreover, the server modules 21 are configured to execute power capping in accordance with the notification.

The above is an example of the configuration of the server device 2. Next, referring to FIG. 11, an example of the operation of the monitor device 25 will be described.

Referring to FIG. 10, in the operation of the monitor device 25, steps S201 to S203 are the same as the steps S101 to S103 in the operation of the monitor device 15 described in the first exemplary embodiment (see FIG. 3). Therefore, a description thereof will be omitted.

When a failure of the CMM 23 is detected at step S203, the failure notification unit 253 notifies the failure of the CMM 23 to the server module 21 (step S204). As a result, power capping is executed by the server modules 21.

The monitor device 25 monitors the CMM 23, for example, in the above manner. Then, in the case of detecting a failure of the CMM 23 as a result of monitoring, the monitor device 25 notifies the failure to the server modules 21. Next, referring to FIG. 12, an example of the operation of the server modules 21 will be described.

Referring to FIG. 11, the server module 21 receives notification of a failure of the CMM 23 from the monitor device 25 (step S301). Then, the control unit 212 of the server module 21 executes power capping in response to the received notification (step S302).

For example, the control unit 212 executes power capping so that the upper limit of power shown by the power upper limit information 213 becomes the upper limit of power consumed by the server module 21 including the control unit 212. Otherwise, for example, the control unit 212 allocates energy to the server module 21 from the power budget included by the power budget information in accordance with the degree of priority shown by the priority degree information 214. Then, the control unit 212 executes power capping so that the allocated energy becomes the upper limit. The control unit 212 executes power capping, for example, in such a manner.

Thus, the server device 2 in this exemplary embodiment has the server modules 21, the CMM 23, and the monitor device 25. Moreover, the monitor device 25 is configured to monitor the CMM 23. Such a configuration allows the monitor device 25 to notify a failure of the CMM 23 to the server modules 21 on the basis of the result of monitoring of the CMM 23. As a result, the server modules 21 can execute power capping on the basis of the notification. In general, the temperature of the server module 21 is thought to increase as the power consumption increases. Therefore, execution of power capping enables control of the temperature of the server module 21. That is to say, it becomes possible to execute thermal control inside the server device 2, and consequently, it becomes possible to secure reliability. Moreover, when compared with the CMM 23, the function of the monitor device 25 is limited and can be realized at low costs. Therefore, it becomes possible to reduce costs when compared with a case of redundant CMMs 23.

In this exemplary embodiment, the monitor device 25 has the failure notification unit 253 instead of the fan control unit 153 described in the first exemplary embodiment. However, the monitor device 25 may have a component equivalent to the fan control unit 153. That is to say, the monitor device 25 may be configured to notify to the server modules 21 and also control the fans 22.

Third Exemplary Embodiment

Figure 12:
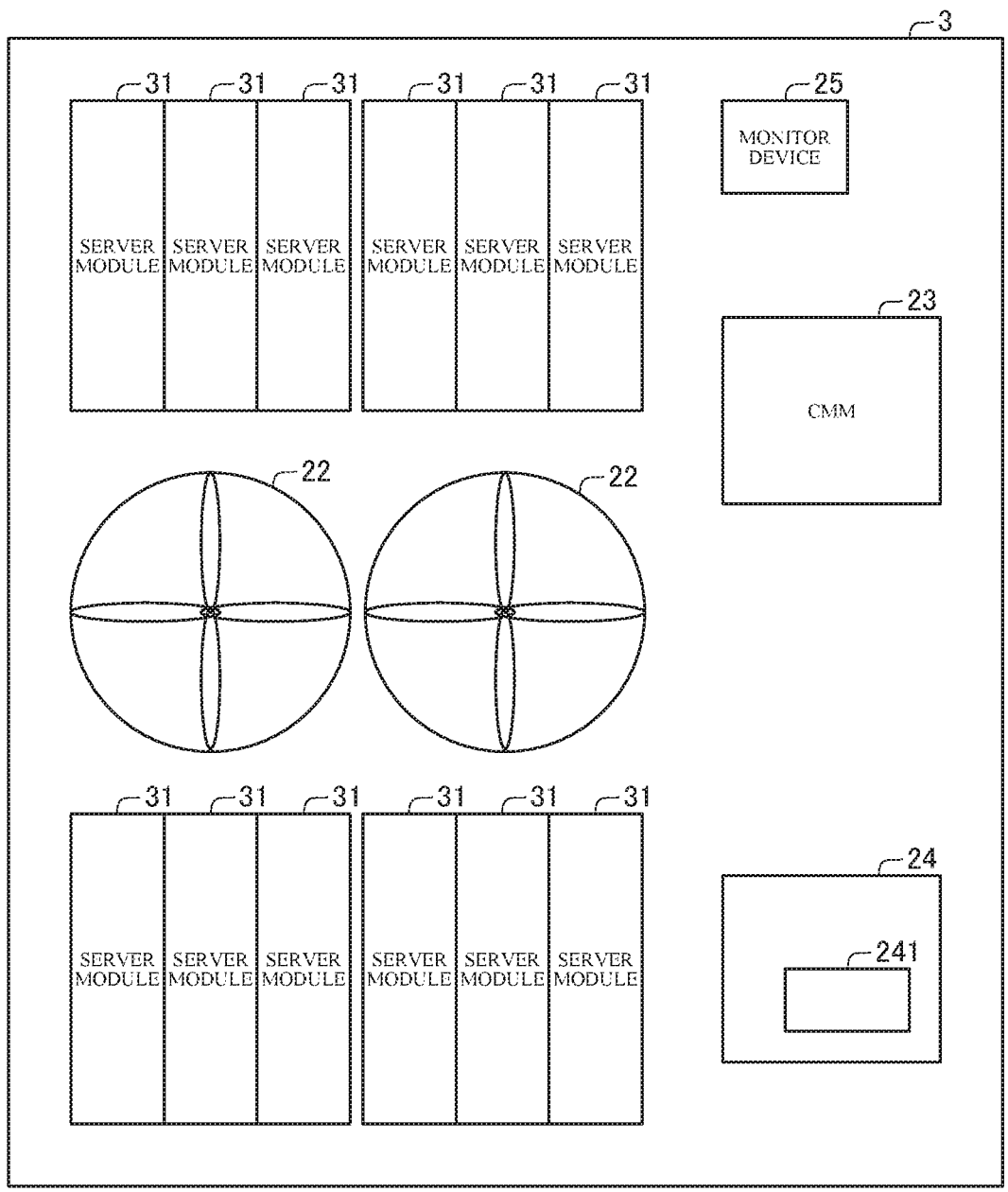
FIG. 12 is a diagram showing an example of the configuration of a server device according to a third exemplary embodiment of the present invention.
Figure 13:
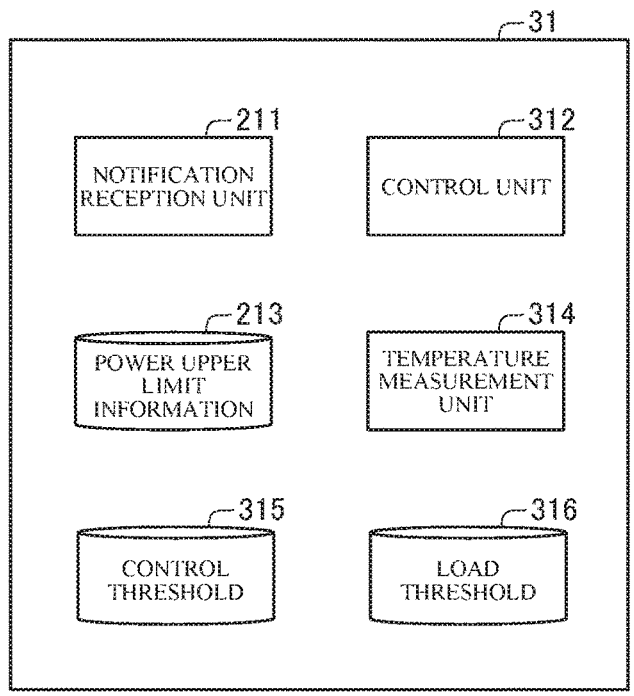
FIG. 13 is a block diagram showing an example of the configuration of the server module shown in FIG. 12.
Figure 14:
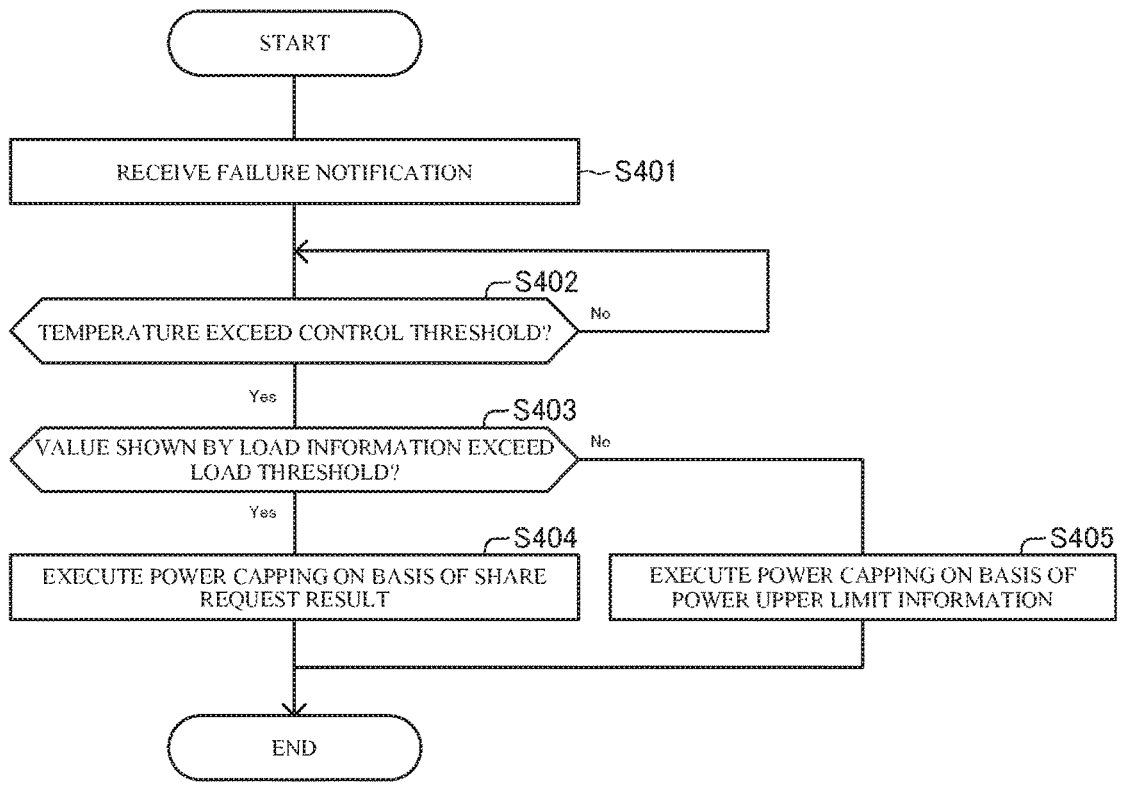
FIG. 14 is a flowchart showing an example of the operation of the server module according to the third exemplary embodiment of the present invention.

Next, a third exemplary embodiment of the present invention will be described with reference to FIGS. 12 to 14. FIG. 12 is a diagram showing an example of the configuration of a server device 3. FIG. 13 is a block diagram showing an example of the configuration of a server module 31. FIG. 14 is a flowchart showing an example of the operation of the server module 31.

In the third exemplary embodiment of the present invention, the server device 3 having a plurality of server modules 31 and a plurality of fans 22 in a chassis will be described.

Referring to FIG. 12, the server device 3 has the server modules 31, the fans 22, the CMM 23, the power supply device 24, and the monitor device 25. As shown in FIG. 12, the server device 3 in this exemplary embodiment has the server modules 31 each having a different configuration from those of the server device 2 described in the second exemplary embodiment (see FIG. 4). On the other hand, the configurations of the fans 22, the CMM 23, the power supply device 24 and the monitor device 25 are the same as those of the server device 2 described in the second exemplary embodiment. Below, a characteristic configuration of this exemplary embodiment will be described.

Referring to FIG. 13, the server module 31 has the notification reception unit 211, a control unit 312, the power upper limit information 213, a temperature measurement unit 314, a control threshold 315, and a load threshold 316. Because the configurations of the notification reception unit 211 and the power upper limit information 213 are the same as in the second exemplary embodiment, a description thereof will be omitted. Although FIG. 13 shows an example that the server module 31 includes the load threshold 316, the server module 31 does not necessarily need to include the load threshold 316. Moreover, the server module 31 in this exemplary embodiment is configured to, for example, be able to communicate with the server modules 31 included by the server device 3.

For example, in a case where the notification reception unit 211 receives notification from the monitor device 25 and a temperature obtained by the temperature measurement unit 314 is more than the control threshold 315, the control unit 312 switches the operation status of the server module 31 from the normal operation to the low-power-consumption operation. That is to say, when receiving notification from the monitor device 25, the control unit 313 puts the upper limit on power consumed by the server module 31 including the control unit 313 on the basis of the result of measurement by the temperature measurement unit 314.

For example, when receiving notification from the monitor device 25, the control unit 312 obtains a measurement result showing the temperature of the server module 31 from the temperature measurement unit 314. Then, the control unit 312 compares the measurement result with the control threshold 315.

In a case where the measurement result is more than the control threshold 315, the control unit 312 refers to the power upper limit information 213. Then, the control unit 312 executes power capping so that the upper limit of power shown by the power upper limit information 213 becomes the upper limit of power consumed by the server module 31 including the control unit 312. On the other hand, in a case where the measurement result is equal to or less than the control threshold 315, the control unit 312 waits until the measurement result exceeds the control threshold 315. The control unit 312 puts the upper limit on power consumed by the server module 31, for example, in this manner.

Further, for example, in a case where the measurement result is more than the control threshold 315, the control unit 312 obtains load information showing the load on the server module 31 on the basis of power actually consumed thereby, a gap between power actually consumed thereby and the power upper limit information 213, or the like. For example, the control unit 312 obtains the value of power consumed by the server module 31 as the load information. Then, the control unit 312 compares the value of the load information with the load threshold 316.

In a case where the value shown by the load information is equal to or less than the load threshold, the control unit 312 refers to the power upper limit information 213 and executes power capping based on the power upper limit information 213. On the other hand, in a case where the value shown by the load information is more than the load threshold, the control unit 312 requests the other server module 31 to give it a share of the power allocation. Then, in the case of being able to receive a share of the power allocation based on the request, the control unit 312 executes power capping so that a value obtained by adding the share to the upper limit of power shown by the power upper limit information 213 becomes the upper limit of power consumed by the server module 31. On the other hand, in the case of being unable to receive a share, the control unit 312 executes power capping based on the power upper limit information 213. The control unit 312 may put the upper limit on power consumed by the server module 31, for example, in this manner. Meanwhile, in the case of giving a share of power allocation to the other server module, the control unit 312 executes power capping so that a value obtained by subtracting the share from the upper limit of power shown by the power upper limit information 213 becomes the upper limit of power consumed by the server module 31.

Meanwhile, the control unit 312 may be configured to compare the load information with the load threshold 316 regardless of the result of comparison of the result of measurement by the temperature measurement unit 314 with the control threshold 315, or instead of the comparison of the measurement result with the control threshold 315.

The temperature measurement unit 314 measures the temperature of the server module 31 including it. The result of measurement by the temperature measurement unit 314 is used by the control unit 312.

The control threshold 315 is a threshold representing a temperature at which the control unit 312 starts power capping. The control threshold 315 is stored in a storage device such as a nonvolatile memory (not shown). As described above, the control threshold 315 is used by the control unit 312 and, in a case where the result of measurement by the temperature measurement unit 314 is more than the control threshold 315, power capping is executed. The value of the control threshold 315 may be any value.

The load threshold 316 is a threshold used for determining whether or not to request the other server module 31 to give it a share of power allocation. The load threshold 316 is stored in a storage device such as a nonvolatile memory which is not shown in the drawings. As described above, the load threshold 316 is used by the control unit 312 and, in a case where a value shown by the load information is equal to or more than the load threshold, the server module 31 requests the other server module 31 to give it a share of power allocation. The value of the load threshold 316 may be any value.

The above is an example of the configuration of a characteristic part in this exemplary embodiment of the configuration of the server device 3. Next, referring to FIG. 14, an example of the operation of the server module 31 will be described.

Referring to FIG. 14, the server module 31 receives notification of a failure of the CMM 23 from the monitor device 25 (step S401).

When receiving the notification, the control unit 312 of the server module 31 compares the result of measurement by the temperature measurement unit 31 with the control threshold 315 (step S402).

In a case where the measurement result is equal to or less than the control threshold 315 (step S402, No), the control unit 312 waits until the result of measurement by the temperature measurement unit 314 exceeds the control threshold 315. On the other hand, in a case where the measurement result is more than the control threshold 315 (step S402, Yes), the control unit 312 compares a value shown by the load information with the load threshold 316 (step S403). Then, in a case where the value shown by the load information is more than the load threshold 316 (step S403, Yes), the control unit 312 requests the other server module 31 to give it a share of power allocation. After that, the control unit 312 executes power capping on the basis of the result of the request for the share (step S404). On the other hand, in a case where the value shown by the load information is equal to or less than the load threshold 316, the control unit 312 executes power capping based on the power upper limit information 213 (step S405). The control unit 312 executes power capping, for example, in this manner.

Thus, the server device 3 in this exemplary embodiment has the server module 31 having the control unit 312 and the temperature measurement unit 314. Such a configuration allows the server device 3 to switch the operation status of the server module 31 from the normal operation to the low-power-consumption operation in a case where the notification reception unit 211 receives notification from the monitor device 25 and a temperature obtained by the temperature measurement unit 314 is more than the control threshold 315. That is to say, the server device 3 can control the temperature of the server module 31 when the CMM 23 is broken and the temperature of the server module 31 exceeds a predetermined temperature. Consequently, it is possible to execute thermal control at necessary timing while preventing execution of power capping at unnecessary timing in terms of thermal control or the like, for example, when the temperature of the server module 31 is low enough though the CMM 23 is broken.

Further, the server device 3 in this exemplary embodiment is configured to, in a case where a value shown by the load information is more than the load threshold, request the other server module 31 to give it a share of power allocation. Consequently, without putting an extreme restriction on the server module 31 with excessive load, it is possible to control the temperatures of the server modules 31 as a whole.

The server device 3 in this exemplary embodiment can include the same modification as in the second exemplary embodiment. For example, the server device 3 can be configured to control the fans 22. Moreover, for example, the server device 3 can be configured to control the fans 22 when the result of measurement by the temperature measurement unit 314 is more than the control threshold 315. Moreover, the server device 3 may be configured to execute power capping on the basis of information equivalent to the priority degree information 214.

Fourth Exemplary Embodiment

Next, referring to FIG. 15, a fourth exemplary embodiment of the present invention will be described. In this exemplary embodiment, the summary of the configuration of a server device 4 having a server module 41 and a cooling fan 42 in a chassis will be described.

Figure 15:
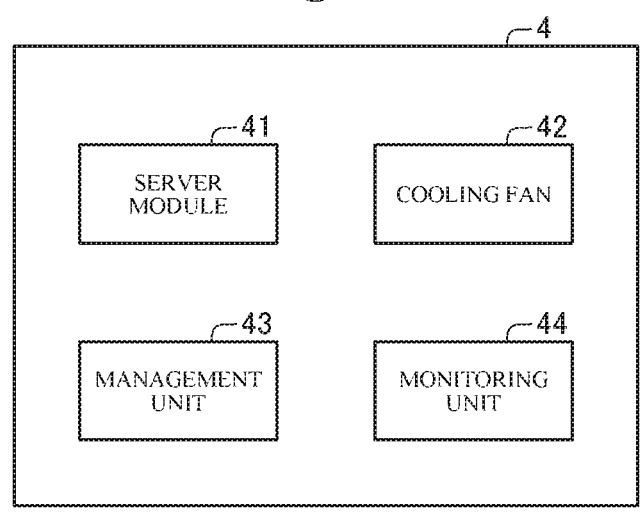
FIG. 15 is a schematic block diagram showing an example of the configuration of a server device according to a fourth exemplary embodiment of the present invention.

Referring to FIG. 15, the server device 4 has the server module 41, the cooling fan 42, a management unit 43, and a monitoring unit 44.

The management unit 43 controls the server module 41 and the cooling fan 42. The monitoring unit 44 monitors the running status of the management unit 43. The monitoring unit 44 executes thermal control of the inside of the chassis on the basis of the result of monitoring of the management unit 43.

Thus, the server device 4 in this exemplary embodiment has the management unit 43 and the monitoring unit 44. Such a configuration allows the monitoring unit 44 to execute thermal control of the inside of the chassis on the basis of the result of monitoring of the management unit 43. As a result, even if having only one management unit 43, the server device can cause the monitoring unit 44 to execute thermal control of the inside of the chassis when the management unit 43 is broken, and reliability can be secured. Moreover, the monitoring unit 44 can be realized at a lower price than the management unit 43. Therefore, by employing the monitoring unit 44 instead of redundant management units 43, it is possible to reduce costs.

The server device 4 can be realized by installation of a given program into the server device 4. To be specific, a program as another aspect of the present invention is a program including instructions for causing a server device to realize one management unit and a monitoring unit. The server device has a server module and a cooling fan in a chassis. The management unit is configured to control the server module and the cooling fan. The monitoring unit is configured to monitor the running status of the management unit. The monitoring unit executes thermal control of the inside of the chassis on the basis of the result of monitoring of the management unit.

Further, a server control method executed by operation of the server device 4 described above is a server control method executed by a server device having a server module and a cooling fan in a chassis, and one management unit configured to control the server module and the cooling fan is provided. The method includes monitoring the running status of the management unit, and executing thermal control of the inside of the chassis on the basis of the result of monitoring of the management unit.

The inventions of the program and the server control method having the abovementioned configurations can achieve the abovementioned object of the present invention because they have the same actions as the server device 4.

<Supplementary Notes>

The whole or part of the exemplary embodiments disclosed above can be described as the following supplementary notes. Below, the overview of a server device and so on of the present invention will be described. However, the present invention is not limited to the following configurations.

(Supplementary Note 1)

A server device having a server module and a cooling fan in a chassis, the server device comprising:
 a single management unit configured to control the server module and the cooling fan; and
 a monitoring unit configured to monitor a running status of the management unit,
 wherein the monitoring unit is configured to execute thermal control of an inside of the chassis on a basis of a result of monitoring of the management unit.

Such a configuration allows the monitoring unit to execute thermal control of the inside of the chassis on the basis of the result of monitoring of the management unit. Consequently, even if only one management unit is provided, it is possible to cause the monitoring unit to execute thermal control of the inside of the chassis when there is a failure in the management unit, and it is possible to secure reliability. Moreover, because the monitoring unit can be realized at a lower price than the management unit, it is possible to reduce costs.

(Supplementary Note 2)

The server device according to Supplementary Note 1, wherein the monitoring unit is configured to control a number of rotations of the cooling fan on a basis of a result of monitoring of the management unit.

Such a configuration allows the monitoring unit to control the number of rotations of the cooling fan on the basis of the result of monitoring of the management unit. Consequently, the monitoring unit can increase the number of the cooling fan, for example, when there is a failure in the management unit. Thus, it is possible to prevent thermal control from being disabled even if there is a failure in the management unit, and it is possible to reduce costs while securing reliability.

(Supplementary Note 3)

The server device according to Supplementary Note 1 or 2, wherein the monitoring unit is configured to execute control to increase a number of rotations of the cooling fan when it is determined that there is a failure in the management unit on a basis of a result of monitoring of the management unit.

(Supplementary Note 4)

The server device according to any of Supplementary Notes 1 to 3, wherein the monitoring unit is configured to execute temperature control on the server module on a basis of a result of monitoring of the management unit.

Such a configuration allows the monitoring unit to execute temperature control on the server module on the basis of the result of monitoring of the management unit. Consequently, the monitoring unit can execute temperature control on the server module, for example, when there is a failure in the management unit. Thus, it is possible to prevent thermal control from being disabled even if there is a failure in the management unit, and it is possible to reduce costs while securing reliability.

(Supplementary Note 5)

The server device according to Supplementary Note 4, wherein the monitoring unit is configured to execute control to put an upper limit on power consumed by the server module on a basis of a result of monitoring of the management unit.

(Supplementary Note 6)

The server device according to Supplementary Note 4 or 5, wherein:
 the monitoring unit is configured to, when it is determined that there is a failure in the management unit on a basis of a result of monitoring of the management unit, give notification of the failure to the server module; and
 the server module is configured to put an upper limit on power consumed thereby on a basis of the notification.

(Supplementary Note 7)

The server device according to Supplementary Note 6, comprising a plurality of server modules,
 wherein each of the server modules puts an upper limit on power consumed thereby in accordance with a predetermined degree of priority.

(Supplementary Note 8)

The server device according to Supplementary Note 6 or 7, wherein the server module has a temperature measurement part configured to measure a temperature and is configured to, when receiving notification from the monitoring unit, put an upper limit on power consumed thereby on a basis of a result of measurement by the temperature measurement part.

(Supplementary Note 9)

The server device according to any of Supplementary Notes 6 to 8, wherein the server module is configured to obtain load information showing a load on the server module itself and is configured to, when receiving notification from the monitoring unit, put an upper limit on power consumed by the server module itself on a basis of the load information.

(Supplementary Note 10)

A server control method executed by a server device having a server module and a cooling fan in a chassis, the server device including a single management unit configured to control the server module and the cooling fan, the server control method comprising:

monitoring a running status of the management unit, and executing thermal control of an inside of the chassis on a basis of a result of monitoring of the management unit.

(Supplementary Note 10-1)

The server control method according to Supplementary Note 10, comprising controlling a number of rotations of the cooling fan on a basis of a result of monitoring of the management unit.

(Supplementary Note 10-2)

The server control method according to Supplementary Note 10 or 10-1, comprising executing temperature control on the server module on a basis of a result of monitoring of the management unit.

(Supplementary Note 11)

A program comprising instructions for causing a server device having a server module and a cooling fan in a chassis to realize:

a single management unit configured to control the server module and the cooling fan; and a monitoring unit configured to monitor a running status of the management unit, wherein the monitoring unit is configured to execute thermal control of an inside of the chassis on a basis of a result of monitoring of the management unit.

(Supplementary Note 11-1)

The program according to Supplementary Note 11, wherein the monitoring unit is configured to control a number of rotations of the cooling fan on a basis of a result of monitoring of the management unit.

(Supplementary Note 11-2)

The program according to Supplementary Note 11 or 11-1, wherein the monitoring unit is configured to execute temperature control on the server module on a basis of a result of monitoring of the management unit.

(Supplementary Note 12)

A non-transitory computer-readable medium storing a program comprising instructions for causing a server device having a server module and a cooling fan in a chassis to realize:

a single management unit configured to control the server module and the cooling fan; and a monitoring unit configured to monitor a running status of the management unit, wherein the monitoring unit being configured to execute thermal control of an inside of the chassis on a basis of a result of monitoring of the management unit.

(Supplementary Note 12-1)

The non-transitory computer-readable medium storing the program according to Supplementary Note 12, wherein the monitoring unit is configured to control a number of rotations of the cooling fan on a basis of a result of monitoring of the management unit.

(Supplementary Note 12-2)

The non-transitory computer-readable medium storing the program according to Supplementary Note 12 or 12-1, wherein the monitoring unit is configured to execute temperature control on the server module on a basis of a result of monitoring of the management unit.

The program described in the exemplary embodiments and supplementary notes is stored in a storage device or recorded on a non-transitory computer-readable medium. For example, the recording medium is a portable medium such as a flexible disk, an optical disk, a magneto-optical disk, and a semiconductor memory.

Although the present invention is described above with reference to the exemplary embodiments, the present invention is not limited to the exemplary embodiments. The configurations and details of the present invention can be changed in various manners that can be understood by one skilled in the art within the scope of the present invention.

DESCRIPTION OF NUMERALS 1, 2 server device
11, 21, 31 server module
211 notification reception unit
212, 312 control unit
213 power upper limit information
214 priority degree information
314 temperature measurement unit
315 control threshold
316 load threshold
12, 22 fan
13, 23 CMM
14, 24 power supply device
241 power supply information
15, 25 monitor device
151, 252 signal transmission and reception unit
152, 252 failure detection unit
153 fan control unit
253 failure notification unit
4 server device
41 server module
42 cooling fan
43 management unit
44 monitoring unit

The invention claimed is:

1. A server device having a server module and a cooling fan in a chassis, the server device comprising:

a management unit configured to control the server module and the cooling fan; and a monitoring unit configured to monitor a running status of the management unit, the monitoring unit being different from the management unit and having a limited function compared to a function of the management unit, wherein the monitoring unit is configured to execute thermal control of an inside of the chassis based on a result of monitoring of the management unit, and wherein the monitoring unit is configured to execute temperature control on the server module based on a result of the monitoring.

2. The server device according to claim 1, wherein the monitoring unit is configured to control a number of rotations of the cooling fan on a basis of a result of monitoring of the management unit.

3. The server device according to claim 1, wherein the monitoring unit is configured to execute control to increase a number of rotations of the cooling fan when it is determined that there is a failure in the management unit on a basis of a result of monitoring of the management unit.

4. The server device according to claim 1, wherein the monitoring unit is configured to execute control to put an upper limit on power consumed by the server module on a basis of a result of monitoring of the management unit.

5. The server device according to claim 1, wherein:
the monitoring unit is configured to, when it is determined that there is a failure in the management unit on a basis of a result of monitoring of the management unit, give notification of the failure to the server module; and
the server module is configured to put an upper limit on power consumed thereby on a basis of the notification.

6. The server device according to claim 5, comprising a plurality of server modules,
wherein each of the server modules puts an upper limit on power consumed thereby in accordance with a predetermined degree of priority.

7. The server device according to claim 5, wherein the server module has a temperature measurement part configured to measure a temperature and is configured to, when receiving notification from the monitoring unit, put an upper limit on power consumed thereby on a basis of a result of measurement by the temperature measurement part.

8. The server device according to claim 5, wherein the server module is configured to obtain load information showing a load on the server module itself and is configured to, when receiving notification from the monitoring unit, put an upper limit on power consumed by the server module itself on a basis of the load information.

9. A server control method executed by a server device having a server module and a cooling fan in a chassis, the server device including a management unit configured to control the server module and the cooling fan, the server control method comprising:
monitoring, by a monitoring unit, a running status of the management unit, the monitoring unit being different from the management unit and having a limited function compared to a function of the management unit,
executing thermal control of an inside of the chassis on a basis of a result of monitoring of the management unit, and
executing temperature control on the server module based on a result of the monitoring.

10. A non-transitory computer-readable medium storing a program comprising instructions for causing a server device having a server module and a cooling fan in a chassis to realize:
a management unit configured to control the server module and the cooling fan; and
a monitoring unit configured to monitor a running status of the management unit, the monitoring unit being different from the management unit and having a limited function compared to a function of the management unit,
wherein the monitoring unit is configured to execute thermal control of an inside of the chassis based on a result of monitoring of the management unit, and
wherein the monitoring unit is configured to execute temperature control on the server module based on a result of the monitoring.

* * * * *